United States Patent
Jung et al.

(10) Patent No.: US 9,899,580 B2
(45) Date of Patent: Feb. 20, 2018

(54) POLYESTER RESIN COMPOSITION HAVING IMPROVED MECHANICAL PROPERTIES AND ANTI-DISCOLORATION

(71) Applicant: Samsung SDI Co., Ltd., Yongin-si (KR)

(72) Inventors: Yoo Jin Jung, Uiwang-si (KR); Tae Gon Kang, Uiwang-si (KR); Chan Moo Park, Uiwang-si (KR); Jong Cheol Lim, Uiwang-si (KR); Sang Hyun Hong, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 261 days.

(21) Appl. No.: 14/632,019

(22) Filed: Feb. 26, 2015

(65) Prior Publication Data

US 2015/0247035 A1    Sep. 3, 2015

(30) Foreign Application Priority Data

Feb. 28, 2014  (KR) .................. 10-2014-0024022
Feb. 13, 2015  (KR) .................. 10-2015-0022497

(51) Int. Cl.
| | |
|---|---|
| H01L 33/60 | (2010.01) |
| C08L 67/02 | (2006.01) |
| H01L 51/52 | (2006.01) |
| C08K 3/00 | (2006.01) |
| C08G 63/02 | (2006.01) |
| C08G 63/06 | (2006.01) |
| C08G 63/127 | (2006.01) |

(52) U.S. Cl.
CPC .............. *H01L 33/60* (2013.01); *C08L 67/02* (2013.01); *C08G 63/02* (2013.01); *C08G 63/06* (2013.01); *C08G 63/127* (2013.01); *C08L 2201/02* (2013.01); *C08L 2201/08* (2013.01); *C08L 2203/20* (2013.01); *C08L 2205/16* (2013.01); *C08L 2207/04* (2013.01); *H01L 51/5271* (2013.01); *H01L 2224/48091* (2013.01)

(58) Field of Classification Search
CPC ......... C08L 67/02; C08G 63/02; C08G 63/06; C08G 63/127
See application file for complete search history.

(56) References Cited

U.S. PATENT DOCUMENTS

| | | | | |
|---|---|---|---|---|
| 4,965,000 A | * | 10/1990 | Potts .................. | C11D 3/001 442/102 |
| 6,417,293 B1 | * | 7/2002 | Chorvath ............. | C08K 5/0091 524/292 |
| 9,437,790 B2 | | 9/2016 | Kim et al. | |
| 2012/0080089 A1 | * | 4/2012 | Aoyama .................. | C08J 5/18 136/256 |
| 2012/0262927 A1 | | 10/2012 | Lu | |
| 2012/0264868 A1 | | 10/2012 | Lu | |
| 2014/0187700 A1 | | 7/2014 | Lee et al. | |
| 2014/0191263 A1 | * | 7/2014 | Wang .................. | C08K 7/14 257/98 |
| 2014/0309356 A1 | | 10/2014 | Kim et al. | |

FOREIGN PATENT DOCUMENTS

| | | |
|---|---|---|
| CN | 103562288 A | 2/2014 |
| CN | 103910979 A | 7/2014 |
| KR | 10-2012-0140332 A | 12/2012 |
| KR | 10-2013-0076733 A | 7/2013 |
| WO | 2012/141967 A | 10/2012 |
| WO | 2012141967 A | 10/2012 |

OTHER PUBLICATIONS

Chinese Office Action in counterpart Chinese Application No. 201510092973.7, dated May 13, 2016, 6 pages.
Office Action in counterpart Korean Application No. 10-2015-0022497 dated Jan. 26, 2017, pp. 1-5.

* cited by examiner

*Primary Examiner* — Melissa A Rioja
(74) *Attorney, Agent, or Firm* — Additon, Higgins & Pendleton, P.A.

(57) ABSTRACT

A polyester resin composition comprises: (A) a first polyester resin having a melting temperature of greater than about 285° C.; (B) a second polyester resin having a melting temperature of less than or equal to about 285° C.; (C) a white pigment; and (D) an inorganic filler. The polyester resin composition may exhibit improved mechanical properties and discoloration resistance and can be used in a molded article, for example, as a LED reflector.

7 Claims, 1 Drawing Sheet

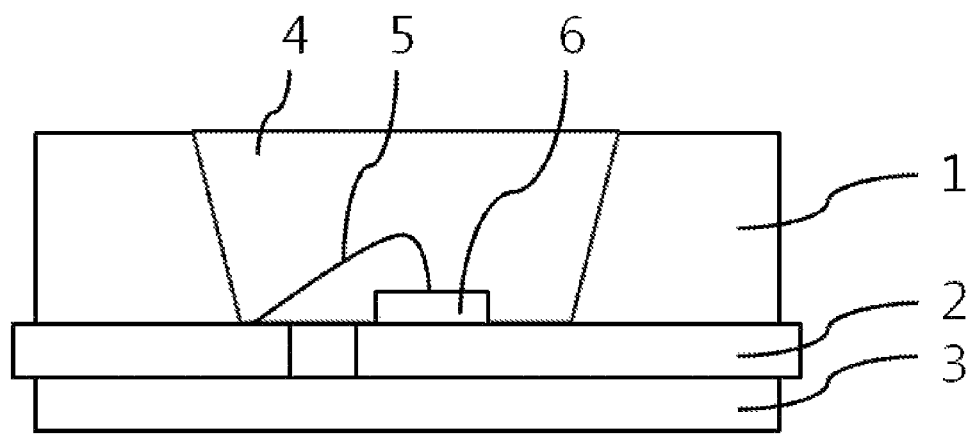

POLYESTER RESIN COMPOSITION HAVING IMPROVED MECHANICAL PROPERTIES AND ANTI-DISCOLORATION

CROSS-REFERENCE TO RELATED APPLICATIONS

This application claims priority to and the benefit of Korean Patent Application No. 10-2014-0024022, filed on Feb. 28, 2014, in the Korean Intellectual Property Office, and Korean Patent Application No. 10-2015-0022497, filed on Feb. 13, 2015, in the Korean Intellectual Property Office, the entire disclosure of each of which is incorporated herein by reference.

FIELD OF THE INVENTION

The present invention relates to a polyester resin composition and a molded article produced using the same.

BACKGROUND

Lighting display devices, such as light emitting diodes (LEDs), organic light emitting diodes (OLEDs), and the like using novel light sources have rapidly superseded existing light sources and have come to the forefront of light technology. The lighting display devices form a lighting display device package together with components such as reflectors, reflector cups, scramblers, housings, etc. The lighting display devices may efficiently utilize light by maximizing optical efficiency while having high reflectivity. To this end, it is desired for materials used for such a component to be able to withstand high temperatures and to minimize decreased whiteness due to reflection and yellowing.

Thermoplastic and thermal resistant polyester resins have been used as the materials for the lighting display devices. The thermoplastic and thermal resistant polyester resins can have minimal deformation and excellent discoloration resistance at high temperatures relative to other resins, but can also exhibit problems of reduced impact resistance.

To resolve the problems, compositions in which white pigments and fillers are added to the polyester resins have been developed. Reference is made, for example, to Korean patent laid-open publication No. 2012-0140332 A, which is directed to a polyester resin composition including a polyester resin defined therein, white pigment, and filler. However, such compositions also can have problems such as dramatically reduced impact strength and moldability depending on the amounts of the white pigments and the fillers, and decreased light stability at high temperatures during long term operations.

Therefore, in the thermoplastic polyester resins used for the components of the lighting display devices, there has been increasing demand for technologies to impart heat resistance to the polyester resins and improve light stability and discoloration resistance of the polyester resins even though exposed to light and heat for a long time, without decreasing moldability and mechanical properties.

SUMMARY

The present invention relates to a polyester resin composition including (A) a first polyester resin having a melting temperature of greater than about 285° C.; (B) a second polyester resin having a melting temperature of less than or equal to about 285° C.; (C) a white pigment; and (D) an inorganic filler.

According to exemplary embodiments, the polyester resin composition may include (A) about 20 wt % to about 80 wt % of the first polyester resin, (B) about 10 wt % to about 70 wt % of the second polyester resin; (C) about 5 wt % to about 60 wt % of the white pigment; and (D) about 1 wt % to about 40 wt % of the inorganic filler.

According to exemplary embodiments, (A) the first polyester resin may be a polyester resin derived from an aromatic dicarboxylic acid and an alicyclic diol and may have a melting temperature of greater than about 285° C. to about 320° C. or less, and (B) the second polyester resin may be a copolyester resin derived from an aromatic dicarboxylic acid and an alicyclic diol and may have a melting temperature of about 250° C. or more to about 285° C. or less.

According to exemplary embodiments, (A) the first polyester resin and/or (B) the second polyester resin may include the basic structure unit represented by Formula 1:

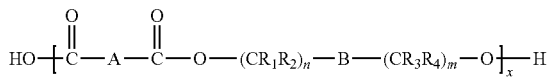

$$\text{HO} \left[ \text{C(=O)} - A - \text{C(=O)} - O - (CR_1R_2)_n - B - (CR_3R_4)_m - O \right]_x H \quad (1)$$

wherein in Formula 1, each A is the same or different and each is independently $C_6$ to $C_{12}$ arylene, each B is the same or different and each is independently $C_3$ to $C_{12}$ cycloalkylene, $R_1$ to $R_4$ are the same or different and are each independently hydrogen or $C_1$ to $C_{10}$ alkyl, n and m are the same or different and are each independently an integer selected from 1 to 10, and x is an integer selected from 10 to 500.

According to exemplary embodiments, the aromatic dicarboxylic acid forming (B) the second polyester resin may include terephthalic acid (TPA) and isophthalic acid (IPA), and a weight ratio of the terephthalic acid to the isophthalic acid may be from about 80 to 99.95 to from about 0.05 to 20.

According to exemplary embodiments, the white pigment may be at least one or more of titanium oxide, zinc oxide, zinc sulfide, lead white (white lead), zinc sulfate, barium sulfate, calcium carbonate, and/or alumina, and the inorganic filler may be at least one or more of glass fiber, carbon fiber, ceramic fiber, metal fiber, silica, talc, clay, mica and/or whisker.

The present invention also relates to a molded article produced from the polyester resin composition as described above.

According to exemplary embodiments, the molded article may satisfy Equations 1 to 3:

$$17 \le Is \le 30 \quad \text{Eq. (1)}$$

$$1000 \le Fs \le 1300 \quad \text{Eq. (2)}$$

$$94.0 \le Re \le 99 \quad \text{Eq. (3)}$$

wherein in Equation (1), Is is impact strength (kgf cm/cm) measured on ⅛ inch samples according to ASTM D256, in Equation (2), Fs is flexural strength (kg f/cm²) measured at a rate of 2.8 mm/min according to ASTM D790, and in Equation (3), Re is an initial reflectivity (%) measured at a wavelength of 450 nm using a color meter.

According to exemplary embodiments, the molded article may have an initial yellowness index of less than about 4, and a yellowness index change (ΔYI) of less than about 7 after leaving the molded article at a temperature of 170° C. for 500 hours.

According to exemplary embodiments, the molded article may be a LED reflector.

The polyester resin composition according to the present invention may have advantages of excellent mechanical properties and/or significantly improved discoloration resistance and/or light stability, such as reflectivity change, etc.

Furthermore, the molded article produced from the polyester resin composition according to the present invention may have advantages of excellent mechanical properties and/or significantly improved discoloration resistance and/or reflectivity change, as well as excellent optical properties adapted for a use as a LED reflector with minimal or no deformation.

BRIEF DESCRIPTION OF THE DRAWINGS

FIG. 1 illustrates a reflector including a resin composition according to one embodiment of the present invention.

DETAILED DESCRIPTION

Exemplary embodiments now will be described more fully hereinafter in the following detailed description, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

In addition, unless the used technical and scientific terms are otherwise specifically defined, the terms are intended to have the meanings ordinarily understood by the person of ordinary skill in the art. Moreover, explanations of known functions and constructions will be omitted in the following detailed description.

A polyester resin composition and a molded article produced from the same of the present invention may decrease yellowness index change and maximize discoloration resistance and light stability, as well as improve significantly mechanical properties such as impact strength, flexural strength, and the like.

Each component will be described more fully hereinafter.

According to exemplary embodiments of the present invention, the polyester resin composition may include a first polyester resin having a melting temperature of greater than about 285° C.; (B) a second polyester resin having a melting temperature of less than or equal to about 285° C.; (C) a white pigment; and (D) an inorganic filler.

(A) First Polyester Resin

A first polyester resin according to exemplary embodiments of the present invention may be used to provide excellent heat resistance, mechanical strength and/or impact resistance. The first polyester resin may be an aromatic polyester resin. The aromatic polyester resin may have high melting point as a result of including a ring structure in the main chain of the polymer.

The first polyester resin may have a melting temperature of greater than about 285° C. For example, the first polyester resin may have a melting temperature of greater than about 285° C. to about 320° C. or less. Within this range of melting temperature, the first polyester may have improved moldability. In addition, if the first polyester resin has a melting temperature in the range of the melting temperature as described above, it may have advantages of excellent heat resistance and/or impact resistance, and can provide improved mechanical properties and/or discoloration resistance when combined with the second polyester resin.

The first polyester resin may be a resin polycondensed by melt polymerization of a dicarboxylic acid component including an aromatic dicarboxylic acid and/or a derivative thereof; and a diol component.

Examples of the dicarboxylic acid of the dicarboxylic acid component can include without limitation terephthalic acid, isophthalic acid, phthalic acid, naphthalene dicarboxylic acid, and the like, lower alkyl (for example $C_1$ to $C_4$ alkyl) esters thereof, and mixtures thereof. In exemplary embodiments, terephthalic acid may be used as the dicarboxylic acid component.

The diol component may include an alicyclic diol to form a repeating unit having a ring structure. For example, the alicyclic diol may be a diol having a saturated hydrocarbon ring and having 3 to 54 carbon atoms in a molecule. In exemplary embodiments, 1,4-cyclohexanedimethanol (CHDM) may be used as the alicyclic diol.

According to exemplary embodiments, the first polyester resin may include the basic structure unit represented by the following Formula 1:

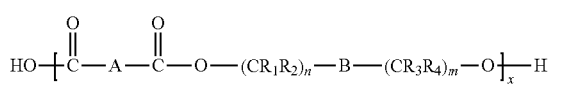

wherein in Formula 1, each A is the same or different and each is independently $C_6$ to $C_{12}$ arylene, each B is the same or different and each is independently $C_3$ to $C_{12}$ cycloalkylene, $R_1$ to $R_4$ are the same or different and are each independently hydrogen or $C_1$ to $C_{10}$ alkyl, n and m are the same or different and are each independently an integer selected from 1 to 10, and x is an integer selected from 10 to 500.

As used herein, the term "arylene" refers a aromatic hydrocarbon group having one or more aromatic rings, each of which may contain four to seven, for example five or six, ring carbon atoms, and can be obtained by removing one hydrogen atom from the ring atoms (for example, one or two ring carbon atoms) of a monocyclic hydrocarbon or a fused ring hydrocarbon. Examples of the arylene may include without limitation p-phenylene, o-phenylene, m-phenylene, naphthalene, and the like, and mixtures thereof.

As used herein, the term "cycloalkylene" refers to a divalent hydrocarbon group obtained by removing one hydrogen atom from a ring atom (for example, one or two ring carbon atoms) of a $C_3$ to $C_{12}$ saturated monocyclic hydrocarbon and/or a $C_3$ to $C_{12}$ saturated bicyclic hydrocarbon. Examples of the cycloalkylene may include without limitation cyclopropylene, cyclobutylene, cyclopentylene, cyclohexylene, cycloheptylene, cyclooctylene, and the like, and mixtures thereof.

In exemplary embodiments, in Formula 1 in the first polyester resin of the present invention, A represents

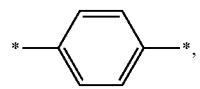

B represents

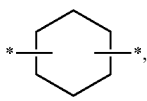

$R_1$ to $R_4$ are each hydrogen, and n and m may each be 1.

Since the first polyester resin of the present invention includes the basic structure unit as described above, it may have advantages of significantly improved heat resistance and/or excellent compatibility with the second polyester resin, and thus can provide significantly improved moldability and/or mechanical properties, as well as discoloration resistance and/or light stability.

The (A) first polyester resin may have an intrinsic viscosity [η] of from about 0.4 dl/g to about 1.5 dl/g, for example from about 0.5 dl/g to about 1.2 dl/g in o-chlorophenol solution measured at 35° C. Within this range, the first polyester resin may have excellent mechanical properties and/or moldability.

The first polyester resin may be prepared by any well known conventional polycondensation process. For example, the polycondensation process may include the direct condensation of one or more dicarboxylic acids with one or more glycols and/or the transesterification reaction of one or more lower alkyl esters of one or more dicarboxylic acids with one or more glycols.

The first polyester resin may have a weight average molecular weight of from about 5,000 g/mol to about 30,000 g/mol, for example from about 5,000 g/mol to about 20,000 g/mol. Within this range, the first polyester resin may have excellent mechanical properties and/or moldability.

The polyester resin composition may include the first polyester resin in an amount of from about 20 wt % to about 80 wt %, for example about 30 wt % to about 60 wt %, based on the total weight (100 wt %) of the polyester resin composition. In some embodiments, the polyester resin composition may include the first polyester resin in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments, the amount of the first polyester resin can be in a range of from about any of the foregoing amounts to about any other of the foregoing amounts.

Within this range, the polyester resin composition may have improved heat resistance, mechanical strength and/or impact resistance. In addition, within this range, the polyester resin composition may have improved moldability.

(B) Second Polyester Resin

A second polyester resin according to one embodiment of the present invention may be used to improve moldability and/or mechanical strength. The second polyester resin may be an aromatic polyester resin like the first polyester resin.

The second polyester resin may have a melting temperature of less than or equal to about 285° C., for example from about 250° C. or more to about 285° C. or less, and as another example from about 250° C. to about 279° C. The second polyester resin has a melting temperature that is different from, and lower than, the melting temperature of the first polyester resin. Within this range, the second polyester resin may provide improved moldability. In addition, within this range, the second polyester resin may have improved compatibility with the first polyester resin, and thus can provide improved mechanical properties and/or discoloration resistance.

Accordingly, if the second polyester resin has a melting temperature in the range as described above, it may have advantages of excellent heat resistance and/or mechanical properties, as well as significantly improved discoloration resistance and/or ability to maintain the reflectivity when combined with the first polyester resin.

The second polyester resin may be a copolymer of the resin polycondensed by melt polymerization of a dicarboxylic acid component including an aromatic dicarboxylic acid and/or a derivative thereof; and a diol component.

For example, one, two, or more of terephthalic acid, isophthalic acid, phthalic acid, naphthalene dicarboxylic acid, and the like may be used as the dicarboxylic acid of the dicarboxylic acid component. In exemplary embodiments, a mixture of terephthalic acid and isophthalic acid may be used.

In one embodiment, the dicarboxylic acid used in the second polyester resin may include terephthalic acid (TPA) and isophthalic acid (IPA), wherein terephthalic acid and isophthalic acid may be present at a weight ratio of from about 80 to 99.95 to from about 0.05 to 20. For example, terephthalic acid and isophthalic acid may be present at a weight ratio of from about 90 to 99.9 to from about 0.1 to 10.

In exemplary embodiments, when the dicarboxylic acid component of the second polyester resin includes both terephthalic acid and isophthalic acid, the dicarboxylic acid component may include terephthalic acid in an amount of about 80, 81, 82, 83, 84, 85, 86, 87, 88, 89, 90, 91, 92, 93, 94, 95, 96, 97, 98, 99, 99.1, 99.2, 99.3, 99.4, 99.5, 99.6, 99.7, 99.8, 99.9, 99.91, 99.92, 99.93, 99.94 or 99.95 wt %. Further, according to some embodiments, the amount of terephthalic acid can be in a range of from about any of the foregoing amounts to about any other of the foregoing amounts.

In exemplary embodiments, when the dicarboxylic acid component of the second polyester resin includes both terephthalic acid and isophthalic acid, the dicarboxylic acid component may include isophthalic acid in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments, the amount of isophthalic acid can be in a range of from about any of the foregoing amounts to about any other of the foregoing amounts Within this range, the second polyester resin may have excellent mechanical properties such as impact strength and/or flexural strength, and/or more excellent crystallization rate and/or moldability.

Accordingly, if terephthalic acid (TPA) and isophthalic acid (IPA) are present in the range of the weight ratio as described above, it can be possible to improve mechanical properties such as impact strength and/or flexural strength with minimal or no deformation of the molded article at high temperatures, as well as improve discoloration resistance caused by light and heat, and/or ability to maintain reflectivity.

An alicyclic diol having ring structure may be used as the diol component to form a repeating unit. For example, 1,4-cyclohexanedimethanol (CHDM) may be used as the alicyclic diol.

According to exemplary embodiments, the second polyester resin may include the basic structure unit represented by the following Formula 1:

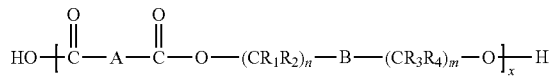

(1)

wherein in Formula 1, each A is the same or different and each is independently $C_6$ to $C_{12}$ arylene, each B is the same or different and each is independently $C_3$ to $C_{12}$ cycloalkylene, $R_1$ to $R_4$ are the same or different and are each independently hydrogen or $C_1$ to $C_{10}$ alkyl, n and m are the same or different and are each independently an integer selected from 1 to 10, and x is an integer selected from 10 to 500.

In exemplary embodiments, A represents

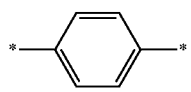

and/or

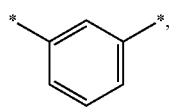

B represents

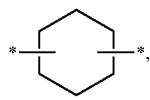

$R_1$ to $R_4$ are hydrogen, and n and m may each be 1 in Formula 1 in the second polyester resin of the present invention.

Since the second polyester resin of the present invention includes the basic structure unit as described above, it may have advantages of excellent compatibility with the first polyester resin and may provide decreased crystallization rate of the polyester resin composition, and thus can provide significantly improved moldability and/or mechanical properties, as well as discoloration resistance and/or light stability.

The (B) second polyester resin may have an intrinsic viscosity [η] of from about 0.5 dl/g to about 2.0 dl/g, for example from about 0.7 dl/g to about 1.5 dl/g in o-chlorophenol solution measured at 35° C. Within this range, the second polyester resin may have excellent mechanical properties and/or moldability.

The second polyester resin may be prepared by any well known conventional polycondensation process. For example, the polycondensation process may include the direct condensation of one or more dicarboxylic acids with one or more glycols and/or the transesterification reaction of one or more lower alkyl esters of one or more dicarboxylic acids with one or more glycols.

The second polyester resin may have a weight average molecular weight of from about about 5,000 g/mol to about 40,000 g/mol, for example from about 5,000 g/mol to about 30,000 g/mol. Within this range, the second polyester resin may have excellent mechanical properties and/or moldability.

The polyester resin composition may include the second polyester resin in an amount of from about 10 wt % to about 70 wt %, for example about 10 wt % to about 50 wt %, based on the total weight (100 wt %) of the polyester resin composition. In some embodiments, the polyester resin composition may include the second polyester resin in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments, the amount of the second polyester resin can be in a range of from about any of the foregoing amounts to about any other of the foregoing amounts.

Within this range, the polyester resin composition may have improved heat resistance and/or moldability.

(C) White Pigment

According to exemplary embodiments, a white pigment may be added to the polyester resin composition to improve reflectivity and/or discoloration resistance. The type of white pigment used is not particularly limited. Examples of the white pigment may include without limitation titanium oxide, zinc oxide, zinc sulfide, lead white (white lead, $2PbCO3.Pb(OH)_2$), zinc sulfate, barium sulfate, calcium carbonate, alumina, and the like, and mixtures thereof.

The white pigment in combination with other components may increase whiteness and/or reflectivity, and may improve discoloration resistance and/or light stability at high temperatures for a long time.

The polyester resin composition may include the white pigment in an amount of from about 5 wt % to about 60 wt %, for example about 15 wt % to about 40 wt %, based on the total weight (100 wt %) of the polyester resin composition. In some embodiments, the polyester resin composition may include the white pigment in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments, the amount of the white pigment can be in a range of from about any of the foregoing amounts to about any other of the foregoing amounts.

Within this range, it is possible to have an effect of increasing whiteness and/or reflectivity, and/or improve impact resistance and/or mechanical strength of the polyester composition.

In exemplary embodiments, titanium oxide, which has high whiteness, light reflectivity and dispersibility, and excellent weather resistance and chemical stability in combination with other components, may be used as the white pigment. Although the crystal structure of the titanium oxide is not particularly limited, titanium oxide having a rutile and/or tetragonal crystal can be used because it can be stable even upon exposure to high temperatures for a long time, and can efficiently prevent the lowering of reflectivity.

The white pigment may have a particle size, for example, from about 0.01 µm to about 2.0 µm, and as another example from about 0.05 µm to about 0.7 µm. Within this range, it may exhibit excellent reflectivity.

A white pigment surface-modified with an organic and/or inorganic surface modifying agent may be used as the white pigment.

Examples of the organic surface modifying agent can include without limitation silane coupling agents, polydimethylsiloxane, trimethylpropane (TMP), pentaerythritol, and the like, alone or in combination with two or more thereof.

For example, the silane coupling agent may include vinyltriethoxysilane, 2-aminopropyl triethoxysilane, and/or 2-glycidoxypropyl triethoxysilane, and the like.

Examples of the inorganic surface modifying agent may include without limitation aluminum oxide (alumina, $Al_2O_3$), silicone dioxide (silica, $SiO_2$), zirconia (zirconium dioxide, $ZrO_2$), sodium silicate, sodium aluminate, sodium aluminum silicate, zinc oxide, and the like, alone or in combination with two or more thereof.

The organic and/or inorganic surface modifying agent may be present in an amount of from 0 part by weight (the surface modifying agent is not present), about 0 part by weight (the surface modifying agent is present) to less than about 5 parts by weight based on about 100 parts by weight of the white pigment. Within this range, it is possible to have an effect of increasing whiteness and/or reflectivity, and/or improve impact resistance and/or mechanical strength of the polyester composition.

(D) Inorganic Filler

According to exemplary embodiments, an inorganic filler may be added to the polyester resin composition to improve intensity of the resin. Examples of the kind or type of inorganic filler may include without limitation fiber-, particle-, load-, needle-, flake-, amorphous-type fillers, and the like, and mixtures thereof. In exemplary embodiments, fiber-type inorganic filler may be used.

For example, at least one or more of fiber-type inorganic filler such as glass fiber, carbon fiber, ceramic fiber, and/or metal fiber, and the like, and/or silica, talc, clay, mica and/or whisker may be used.

In exemplary embodiments, the inorganic filler may be a glass fiber.

In exemplary embodiments, the glass fiber may have a cross-sectional diameter of from about 5 μm to about 20 and may have a cylindrical (round) cross-section and have a length of from about 2 mm to about 5 mm prior to processing. In other exemplary embodiments, the glass fiber may have a cross-sectional aspect ratio (long diameter of the cross-section/short diameter of the cross-section) of from about 1.5 to about 10, and may have a plate type (flat) cross-section and have a length of from about 2 mm to about 5 mm prior to processing. If such inorganic filler is used, it is possible to improve moldability of the resin, and/or improve significantly mechanical properties such as flexural strength, impact strength, etc. of the molded article.

An inorganic filler surface coated with a surface modifying agent may be used to increase adhesion with the polyester resin. Examples of the surface modifying agent may include without limitation silane compounds, urethane compounds, epoxy compounds, and the like, and mixtures thereof.

According to exemplary embodiments, the polyester resin composition may include inorganic filler in an amount of from about 1 wt % to about 40 wt %, for example about 10 wt % to about 20 wt %, based on the total weight (100 wt %) of the polyester resin composition. In some embodiments, the polyester resin composition may include the inorganic filler in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments, the amount of the inorganic filler can be in a range of from about any of the foregoing amounts to about any other of the foregoing amounts.

Within this range, it is possible to improve mechanical properties and/or heat resistance. In addition, within this range, it is possible to improve fluidity and/or moldability.

In exemplary embodiments, the polyester resin composition can include a total (combined) amount of the white pigment and the inorganic filler of from about 6 wt % to about 61 wt %, for example, from about 45 wt % to about 55 wt %, based on the total weight (100 wt %) of the polyester resin composition. In some embodiments, the polyester resin composition may include the white pigment and the inorganic filler in a total amount of about 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, or 61 wt %. Further, according to some embodiments, the total amount of the white pigment and the inorganic filler can be in a range of from about any of the foregoing amounts to about any other of the foregoing amounts.

Within this range, it is possible to achieve excellent mechanical properties and/or heat resistance, and/or improve discoloration resistance.

The polyester resin composition of the present invention may further include one or more typical additives in addition to the components described above depending on the intended use. Examples of the additives may include without limitation one or more of antimicrobial agent, thermal stabilizer, oxidant, releasing agent, photostabilizer, surfactant, coupling agent, plasticizer, compatibilizer, lubricant, antistatic agent, flame retardant, auxiliary flame retardant, anti-dripping agent, weather-resistance agent, UV absorber and stabilizer, and the like, and mixtures thereof.

The additives may be present in an amount selected to minimize deterioration of the physical properties of the polyester resin composition. For example, the additives may be present in an amount of about 20 parts by weight or less, for example from about 0.1 parts by weight to about 15 parts by weight, based on about 100 parts by weight of the polyester resin composition.

The polyester resin composition of the present invention may be prepared by any well known method. The polyester resin composition may be prepared, for example, by mixing each components and optional additives in a Henschel mixer, a V blender, a tumbler blender, a ribbon blender, and the like, and melt extruding the resultant mixture using a single-screw or twin-screw extruder at a temperature of about 150° C. to about 350° C. to form a pellet. For example, the pellet may be prepared by extruding the mixture at a screw rotation speed of about 300 rpm to about 600 rpm, and at a self supply rate of about 60 kg/hr to about 600 kg/hr at a temperature of about 250° C. to about 310° C. using a twin-screw extruder having about L/D=29 and about Φ=36 mm. In one embodiment, the prepared pellet may be subjected to an injection molding process into a specimen by drying it at about 80° C. for about 4 hours.

The present invention also provides a molded article that can have significantly improved mechanical properties and/or discoloration resistance, prepared by molding the polyester resin composition. The molded article may be prepared by any conventional molding process known in the art, such as but not limited to injection molding, double-shot injection molding, blow molding, extrusion molding, thermal molding, and the like, using the polyester resin composition.

According to exemplary embodiments, the molded article may satisfy Equations (1) to (3):

$$17 \leq Is \leq 30 \qquad \text{Eq. (1)}$$

$$1000 \leq Fs \leq 1300 \qquad \text{Eq. (2)}$$

$$94.0 \leq Re \leq 99 \qquad \text{Eq. (3)}$$

wherein in Equation (1), Is is impact strength (kgf cm/cm) measured on ⅛ inch samples according to ASTM D256, in Equation (2), Fs is flexural strength (kg f/cm²) measured at a rate of 2.8 mm/min according to ASTM D790, and in Equation (3), Re is initial reflectivity (%) measured at a wavelength of 450 nm using a color meter.

Furthermore, the molded article may have an initial yellowness index of less than about 4, and yellowness index change (Δ&I) of less than about 7 after leaving the article at a temperature of 170° C. for 500 hours (under constant temperature conditions). The initial yellowness index, the yellowness index after remaining under constant temperature conditions, and the yellowness index change (ΔYI) may be determined using a Minolta CM-3600D CIE Lab. color meter (spectrophotometer) according to ASTM D1925 as described in the following Examples.

The molded article prepared from the polyester resin composition of the present invention may include a polyester resin having a melting temperature of greater than 285° C., a polyester resin having a melting temperature of less than or equal to 285° C., a white pigment, and an inorganic filler. As a result, it is possible to provide a molded article having excellent initial yellowness index and/or reflectivity, and/or decreased changes thereof, and thus significantly improved discoloration resistance and/or light stability without causing deformation even at high temperatures for a long time. Thus, the molded article may be advantageously used as a LED reflector requiring the above-mentioned properties.

FIG. 1 is a cross-sectional view of a semiconductor apparatus (reflector package) including a molded article according to the present invention. As shown in FIG. 1, a reflector or reflector cup 1 may be a molded article prepared from the polyester resin composition according to the present invention. The prepared reflector cup 1 may be assembled with a variety of the known electrodes 2, substrates 3, sealing resins 4, wires 5, and light emitting diodes (LEDs) 6 together into a reflector package product. Furthermore, it will be understood by those skilled in the art that various modifications and changes may be made to the configuration from the disclosure as described above.

Hereinafter, the present invention will be described with reference to the following examples, but the present invention will not be limited to the following Examples.

Measurement of Physical Properties (1) Measurement of Izod Impact Strength (Unit: kg·cm/cm)

Izod impact strength is measured on ⅛ inch thick specimens according to ASTM D256.

(2) Measurement of Flexural Strength (Unit: kg f/cm²)

Flexural strength is measured on ⅛ inch thick specimens at a rate of 2.8 mm/min according to ASTM D790.

(3) Measurement of Yellowness Index (YI) Change (Unit: %)

Yellowness index (YI) change is measured on 2.5 mm thick specimens by determining the yellowness index before and after exposure to a constant temperature, using a Minolta CM-3600D CIE Lab. color meter (spectrophotometer) according to ASTM D1925 and calculating the yellowness index change (ΔYI) according to Eq. 4 below:

$$\Delta YI = YI_1 - YI_0 \qquad \text{Eq. (4)}$$

wherein in Equation (4), $YI_0$ is an initial yellowness index of the specimen before exposure to a constant temperature, and $YI_1$ is a yellowness index after the specimen is maintained in a constant temperature and constant humidity oven maintained at 170° C. and 85% relative humidity (R.H.) for 500 hours under a LED light source at a wavelength of 450 nm.

(4) Measurement of Reflectivity (Reflectance) Change (Unit: %)

Reflectivity is measured on 2.5 mm thick flake-like specimens for the reflectivity (SCI, specular component included) using a Minolta CM-3600D CIE Lab. color meter at a wavelength of 450 nm. The reflectivity is measured before and after maintaining the specimens under constant temperature and constant pressure conditions, to calculate the reflectivity change (ΔRe) according to the following Eq. 5:

$$\Delta Re = Re_1 - Re_0 \qquad \text{Eq. (5)}$$

wherein in Equation (5), $Re_0$ is an initial reflectivity of the specimen before exposure to a constant temperature, and $Re_1$ is a reflectivity after the specimen is maintained in a constant temperature and constant humidity oven maintained at 170° C. and 85% R.H. for 500 hours under a LED light source at a wavelength of 450 nm.

(5) Evaluation of Reflector Deformation

The pellets prepared in Examples 1 to 3 and Comparative Examples 1 to 4, are dried at 80° C. for 4 hours. Then, the dried pellets are injection molded to manufacture a reflector cup. Thereby, a LED reflector is prepared.

A LED reflector is prepared by mounting the prepared reflector cup and a LED device on a substrate for reflectors, on which electrodes are formed, and electronically connecting those with a metal line using a wire.

The prepared reflector is left at a high temperature (260° C.) for 5 minutes to determine visually whether deformation occurs. If deformation occurs, this is represented by a symbol of "o," and if deformation did not occur, this is represented by a symbol of "X." The results thereof are shown in Table 2.

The detailed specification of the components used in the Examples and Comparative Examples is as follows.

(A) First Polyester Resin

PCT Polyester PURATAN™ 0302 (melting temperature: 290° C.) from SK Chemicals is used.

(B) Second Polyester Resin

Eastman™ copolyester 13319 (melting temperature: 285° C.) from Eastman Chemical Co. is used (TPA:IPA=95.24:4.76).

(B') Amorphous Polyester Resin

PCTG (amorphous resin) SKYGREEN® JN100 (glass transition temperature: 60° C.) from SK Chemicals is used.

(C) White Pigment

TI-Pure® R-105 (titanium dioxide) from DuPont, Co. is used.

(D) Inorganic Filler

A round type glass fiber (Owens Corning, #910) having a cross-sectional diameter of 10 μm, an aspect ratio of long diameter to short diameter of the cross-section of 1, and an average length of 3 mm is used.

Example 1

As shown in Table 1, 40 wt % of (A) a first polyester resin, 10 wt % of (B) a second polyester resin, 35 wt % of (C) a white pigment and 15 wt % of (D) an inorganic filler are mixed, and dry blended to prepare a polyester resin composition. The composition is processed into a pellet using a twin screw extruder with Φ=36 mm at a nozzle temperature of from 250° C. to 310° C. The prepared pellet is dried at 80° C. for 4 hours, and a specimen is injection molded and evaluated for physical properties, the results of which are shown in Table 2.

Examples 2 to 3

As shown in Table 1, the polyester resin compositions are prepared in the same manner as Example 1, except that the amounts of (A) the first polyester resin, (B) the second polyester resin, (C) the white pigment and (D) the inorganic filler are changed. The measured physical properties are shown in Table 2.

Comparative Examples 1 to 2

As shown in Table 1, the polyester resin compositions are prepared in the same manner as Example 1, except that (B) the second polyester resin is not used, and the amounts of (A) the first polyester resin, (C) the white pigment and (D) the inorganic filler are changed. The measured physical properties are shown in Table 2.

Comparative Example 3

As shown in Table 1, the polyester resin composition is prepared in the same manner as Example 1, except that (B) the second polyester resin is not used, and (B') an amorphous polyester resin is used. The measured physical properties are shown in Table 2.

Comparative Example 4

As shown in Table 1, the polyester resin composition is prepared in the same manner as Example 1, except that (A) the first polyester resin is not used, and the amounts of (B) the second polyester resin, (C) the white pigment and (D) the inorganic filler are changed. The measured physical properties are shown in Table 2.

TABLE 1

|  | Examples | | | Comparative Examples | | | |
| --- | --- | --- | --- | --- | --- | --- | --- |
|  | 1 | 2 | 3 | 1 | 2 | 3 | 4 |
| (A) First polyester resin (wt %) | 40 | 35 | 15 | 60 | 50 | 40 | — |
| (B) Second polyester resin (wt %) | 10 | 15 | 35 | — | — | — | 60 |
| (B') Amorphous polyester resin (wt %) | — | — | — | — | — | 10 | — |
| (C) White Pigment (wt %) | 35 | 35 | 35 | 20 | 35 | 35 | 20 |
| (D) Inorganic filler (wt %) | 15 | 15 | 15 | 20 | 15 | 15 | 20 |

TABLE 2

| Classification | | Examples | | | Comparative Examples | | | |
| --- | --- | --- | --- | --- | --- | --- | --- | --- |
|  |  | 1 | 2 | 3 | 1 | 2 | 3 | 4 |
| Impact strength | kg f · cm/cm | 17 | 18 | 18 | 13 | 16 | 16 | 21 |
| Flexural strength | kg/cm$^2$ | 1010 | 1050 | 1080 | 820 | 940 | 930 | 1100 |
| Reflector deformation | 260° C./5 min | X | X | X | X | X | X | ○ |
| yellowness index (@170° C.) | $YI_0$ | 3.3 | 3.4 | 3.5 | 3.8 | 3.3 | 3.1 | 3.9 |
|  | $YI_1$ (500 hr) | 9.8 | 9.7 | 10.4 | 18.5 | 10.2 | 10.6 | 11.7 |
|  | ΔYI | 6.5 | 6.3 | 6.9 | 14.7 | 6.9 | 7.5 | 7.8 |
| Reflectivity (Reflectance) | $Re_0$ | 94.5 | 94.5 | 94.4 | 93.5 | 93.8 | 94.1 | 94.4 |
|  | $Re_1$ (500 hr) | 85.9 | 86.1 | 86.2 | 83.5 | 85.4 | 84.6 | 86.4 |
|  | ΔRe | 8.6 | 8.4 | 8.2 | 10.0 | 8.4 | 9.5 | 8.0 |

As shown in Table 2, it can be seen that Examples 1 to 3 according to the present invention exhibit excellent mechanical properties such as impact strength, and flexural strength, did not cause reflector deformation at high temperatures (260° C.), and have excellent initial yellowness index and reflectivity. It can be also seen that Examples 1 to 3 did not experience the greatly reduced yellowness index and reflectivity, and changes thereof even if left at high temperatures for a long time.

Meanwhile, Comparative Examples 1 and 2, which do not include the second polyester resin, exhibit significantly reduced mechanical properties such as impact strength and flexural strength, as well as significantly reduced discoloration resistance and light stability.

Furthermore, Comparative Example 3, which includes the amorphous polyester resin instead of the second polyester resin to reduce the crystallization rate, exhibits reduced mechanical properties, discoloration resistance and light stability relative to the Examples, and exhibits reduced crystallization rate and deteriorated moldability.

In addition, Comparative Example 4, which did not include the first polyester resin, exhibits improved mechanical properties, but exhibits reflector deformation when left at 260° C. for 5 minutes due to non-uniform molding.

Therefore, it is possible to improve significantly mechanical properties as well as discoloration resistance and light stability, and enhance greatly moldability and molding stability by using the first polyester resin and the second polyester resin in amounts as described herein.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims. Many modifications and other embodiments of the invention will come to mind to one skilled in the art to which this invention pertains. Therefore, it is to be understood that the invention is not to be limited to the specific embodiments disclosed and that such modifications and other embodiments are intended to be included within the scope of the appended claims.

DESCRIPTION OF REFERENCE NUMERALS

| 1: reflector | | |
|---|---|---|
| 2: electrode | 3: substrate | |
| 4: sealing resin | 5: wire | 6: LED |

What is claimed is:

1. A polyester resin composition comprising:
   about 15 wt % to about 80 wt % of (A) a first polyester resin derived from an aromatic dicarboxylic acid and an alicyclic diol and having a melting temperature of greater than about 285° C. to about 320° C.;
   about 10 wt % to about 70 wt % of (B) a second polyester resin that is not the same as the first polyester resin, wherein the second polyester resin is a copolyester resin derived from an aromatic dicarboxylic acid and an alicyclic diol having a melting temperature of about 250° C. to about 285° C., wherein the aromatic dicarboxylic acid forming the second polyester resin comprises about 80 to 99.95 weight percent terephthalic acid (TPA) and about 0.05 to 20 weight percent isophthalic acid (IPA);
   about 5 wt % to about 60 wt % of (C) a white pigment; and
   about 1 wt % to about 40 wt % of (D) an inorganic filler,
   wherein a molded article produced from the polyester resin composition has an initial yellowness index of less than about 4, and a yellowness index change (ΔYI) of less than about 7 after leaving the article at a temperature of 170° C. for 500 hours.

2. The polyester resin composition according to claim 1, wherein (A) the first polyester resin and/or (B) the second polyester resin has a structure represented by the following Formula 1:

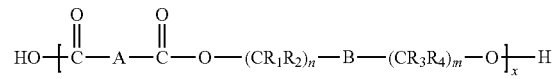

(1)

wherein in Formula 1, each A is the same or different and each is independently $C_6$ to $C_{12}$ arylene, each B is the same or different and each is independently $C_3$ to $C_{12}$ cycloalkylene, $R_1$ to $R_4$ are the same or different and are each independently hydrogen or $C_1$ to $C_{10}$ alkyl, n and m are the same or different and are each independently an integer selected from 1 to 10, and x is an integer selected from 10 to 500, with the proviso that for (B) the second polyester resin, A comprises units derived from terephthalic acid (TPA) and isophthalic acid (IPA).

3. The polyester resin composition according to claim 1, wherein the white pigment comprises titanium oxide, zinc oxide, zinc sulfide, lead white, zinc sulfate, barium sulfate, calcium carbonate, alumina or a mixture thereof, and the inorganic filler comprises glass fiber, carbon fiber, ceramic fiber, metal fiber, silica, talc, clay, mica, whisker, or a mixture thereof.

4. A molded article produced from the polyester resin composition according to claim 1.

5. The molded article according to claim 4, wherein the molded article satisfies Equations 1 to 3:

$17 \leq Is \leq 30$  Eq. (1)

$1000 \leq Fs \leq 1300$  Eq. (2)

$94.0 \leq Re \leq 99$  Eq. (3)

wherein in Equation (1), Is is impact strength measured in kgf·cm/cm on ⅛ inch samples according to ASTM D256, in equation (2), Fs is flexural strength measured in kgf/cm² at a rate of 2.8 mm/min according to ASTM D790, and in Equation (3), Re is an initial reflectivity percentage value measured at a wavelength of 450 nm using a color meter.

6. The molded article according to claim 4, wherein the molded article is a LED reflector.

7. The polyester resin composition according to claim 1, wherein a molded article produced from the polyester resin composition satisfies Equations 1 to 3:

$17 \leq Is \leq 30$  Eq. (1)

$1000 \leq Fs \leq 1300$  Eq. (2)

$94.0 \leq Re \leq 99$  Eq. (3)

wherein in Equation (1), Is is impact strength measured in kgf·cm/cm on ⅛ inch samples according to ASTM D256, in equation (2), Fs is flexural strength measured in kgf/cm² at a rate of 2.8 mm/min according to ASTM D790, and in Equation (3), Re is an initial reflectivity percentage value measured at a wavelength of 450 nm using a color meter.

* * * * *

UNITED STATES PATENT AND TRADEMARK OFFICE
CERTIFICATE OF CORRECTION

PATENT NO. : 9,899,580 B2  
APPLICATION NO. : 14/632019  
DATED : February 20, 2018  
INVENTOR(S) : Yoo Jin Jung et al.

Page 1 of 1

It is certified that error appears in the above-identified patent and that said Letters Patent is hereby corrected as shown below:

In the Specification

Column 9 delete Line 37 and insert:  
-- cross-sectional diameter of from about 5 μm to about 20 μm, and --

Column 11 delete Line 18 and insert:  
-- change ($\Delta$YI) of less than about 7 after leaving the article at --

Signed and Sealed this  
Ninth Day of October, 2018

Andrei Iancu  
*Director of the United States Patent and Trademark Office*